US006512243B1

(12) United States Patent
Kim et al.

(10) Patent No.: US 6,512,243 B1
(45) Date of Patent: Jan. 28, 2003

(54) THIN FILM TRANSISTOR ASSEMBLY, PARTICULARLY SUITABLE FOR LIQUID CRYSTAL DISPLAY DEVICE, AND PROCESS FOR FABRICATING THE SAME

(75) Inventors: Joo-Young Kim, Busan Si (KR); Woong-Kwon Kim, Kyunggi Do (KR); Young-Jin Oh, Kyunggi Do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 35 days.

(21) Appl. No.: 09/686,814

(22) Filed: Oct. 12, 2000

Related U.S. Application Data

(62) Division of application No. 09/247,368, filed on Feb. 10, 1999.

(30) Foreign Application Priority Data

Jun. 1, 1998 (KR) ............................. 98-20196

(51) Int. Cl.$^7$ ..................... H01L 29/104; G02F 1/1333; G02R 1/1343
(52) U.S. Cl. ............................. 257/59; 257/59; 257/72; 349/138; 349/140
(58) Field of Search ........................... 257/154, 59, 69, 257/72, 350, 347, 351, 349; 438/161, 162, 166, 164, 149, 153–154; 349/125, 138, 149, 152, 42, 43, 46, 54, 139, 140, 143

(56) References Cited

U.S. PATENT DOCUMENTS 6,153,893 A * 11/2000 Inoue et al. ................. 257/408

* cited by examiner

Primary Examiner—Wael Faberry
Assistant Examiner—Brook Kebede
(74) Attorney, Agent, or Firm—McKenna Long & Aldridge LLP

(57) ABSTRACT

A method of fabricating a thin film transistor (TFT) assembly having a plurality of array lines, a plurality of pads, a plurality of link lines connecting the pads to the array lines, an insulating layer, and an electrode pattern formed on a substrate, and further having short-preventing structures for preventing electrical shorts between the pads and the link lines. The method includes the steps of forming the plurality of pads on the substrata, depositing the insulating layer on the substrate including over the pads, etching the insulating layer, to form contact holes, and etching the insulating layer between the adjacent pads to expose a surface of the substrate to prevent a short between the adjacent pads from occurring, and forming the electrode pattern on the insulating layer by depositing and patterning an electrode layer such that the electrode pattern contacts the pads through the contact holes formed in the insulating layer. The steps of etching the insulating layer between the adjacent pads is performed concurrently with the etching step for forming the contact holes. In addition, the areas between adjacent pads are further etched concurrently with the step of etching the electrode layer.

10 Claims, 6 Drawing Sheets

THIN FILM TRANSISTOR ASSEMBLY, PARTICULARLY SUITABLE FOR LIQUID CRYSTAL DISPLAY DEVICE, AND PROCESS FOR FABRICATING THE SAME

CROSS REFERENCE TO RELATED ART

This is a division of application Ser. No. 09/247,368, filed Feb. 10, 1999.

This application claims priority of Korean patent application No. 98-20196 filed on Jun. 1, 1998, the entire disclosure of which is incorporated herein by reference.

BACKGROUND OF THE INVENTION

1. Field of the Invention

The present invention relates to a thin film transistor (TFT) assembly, and in particular, to a TFT suitable for a liquid crystal display (LCD) device, and a method of fabricating the same.

2. Description of the Related Art

Generally, a TFT is used as a switching element in, for example, art LCD device. A well known TFT assembly includes a substrate, gate and data lines formed on the substrate in a matrix pattern, and gate and data pads for transmitting drive signals from a drive circuit to the gate and data lines.

FIG. 1 schematically illustrates gate and data pads of a TFT assembly, and FIG. 2 shows an enlarged view of a circled portion A of FIG. 1 for illustrating a portion where gate pads and link lines are formed.

Referring first to FIG. 1, a TFT assembly comprises a plurality of gate pads 10 connected to gate lines (not shown) formed an a substrate 40, and a plurality of data pads 20 connected to data lines (not shown) formed on the substrate 40. The gate and data lines are generally arranged to form a matrix pattern (not shown). As shown in FIG. 2, gate drive signals are transmitted from a drive circuit (not shown) to the gate pads 10, and from the gate pads to the gate lines through link lines 11. The gate drive signals transmitted to the gate lines are further transmitted to corresponding thin film transistors to drive the same. Short circuits frequently occur during the manufacturing of the TFT assembly between adjacent pads 10 and between adjacent link lines 11 due to metal remainders or residues 14a and 14b, respectively.

The metal remainders 14a and lab will be described in more detail with reference to FIGS. 3a and 3b, which are sectional views taken along lines I—I and II—II of FIG. 2, respectively.

Referring first to FIG. 3a, there is provided a substrate 13 on which the gate pads 10 are deposited using, for example, an aluminum evaporation process. Formed on the gate pads 10 is a metal layer 16 made of, for example, molybdenum (Mo) to prevent hillock from occurring on the aluminum surfaces of gate pads 10. Deposited on the substrate 13 to cover the gate pads 10 and the metal layer 16 are, in order, a gate insulating layer 17 and a passivation layer 18 that are made of a silicon oxide or a silicon nitride. In addition, contact holes are formed by etching portions of the gate insulating and passivation layers 17 and 18, which correspond to the gate pads 10, using, for example, a masking process, such that the metal layer 16 is exposed. Indium tin oxide (ITO) electrodes 19 are formed on the passivation layer 18 such that they contact the metal layer 16 through the contact holes.

Referring to FIG. 3b, a structure of the link line portion is substantially the same as that of the pad portion shown is FIG. 3a except that there are no contact holes is the gate insulating and passivation layers 17 and 18. That is, portions of the gate insulating and passivation layer 17 and 18 corresponding to the link lines 11 are not etched. The ITO electrodes 19 are formed an the portions of the passivation layer 18 corresponding to the link lines 11.

In the above described TFT assembly, during an aluminum evaporation process for forming the pads 10 and the link lines 11, or during a masking process for forming the metal layer 16, metal remainders 14a or 14b may be formed on the substrate. The metal remainders 14a or 14b may electrically interconnect the adjacent pads 10 or the adjacent link lines 11, as shown in FIGS. 3a and 3b. The metal remainders 14a and 14b cause a short circuit between the adjacent pads 10 and between the adjacent link lines 11.

In an effort to overcome this drawback, a short circuit inspecting device has been used to detect short circuits in the TFT assembly and to repair the same. For example, metal remainders (short circuits) may be disconnected using a laser after being detected. However, this process is time consuming and reduces overall manufacturing productivity.

SUMMARY OF THE INVENTION

Accordingly, the present invention is directed to a TFT assembly and a method of fabricating the same that substantially obviate one or more of the problems due to limitations and disadvantages of the related art.

It is an object of the present invention to provide a TFT assembly having a structure for preventing a short circuit from occurring between adjacent pads or between adjacent links.

It is another object of the present invention to provide a method of fabricating a TFT assembly including a step for preventing a short circuit from occurring between adjacent pads or between adjacent links.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance wish the purpose of the present invention, as embodied and broadly described, the present invention provides a method of fabricating a semiconductor device having a plurality of conductive structures formed on a substrate for transmitting signals, the method comprising the steps of forming a plurality of conductive structures on the substrate; depositing an insulating layer on the conductive structures and the substrate; and etching portions of the insulating layer between adjacent conductive structures to expose a surface of the substrate, thereby preventing an electrical shore between the adjacent conductive structures.

According to another embodiment of the present invention, a method of fabricating a semiconductor device comprises the steps of forming a plurality of pads on the substrate depositing an insulating layer on the substrate; and forming an electrode pattern on the insulating layer, the electrode pattern contacting the pads through a plurality of contact holes formed in the insulating layer, wherein the insulating layer between adjacent pads is etched to expose a surface of the substrate, whereby a short between the adjacent pads due to a metal remainder formed when the pads are formed is prevented.

According to another aspect of the present invention, a semiconductor device comprises a substrate; a plurality of conductive structures on the substrate; an insulating layer on the substrate and the conductive structures; an electrode pattern on the insulating layer, the electrode pattern contacting at least some of the conductive structures through a plurality of contact hales in the insulating layer; and at least one insulating channel between adjacent conductive structures, a surface of the substrate being exposed through the insulating channel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENTS

Figure 1:
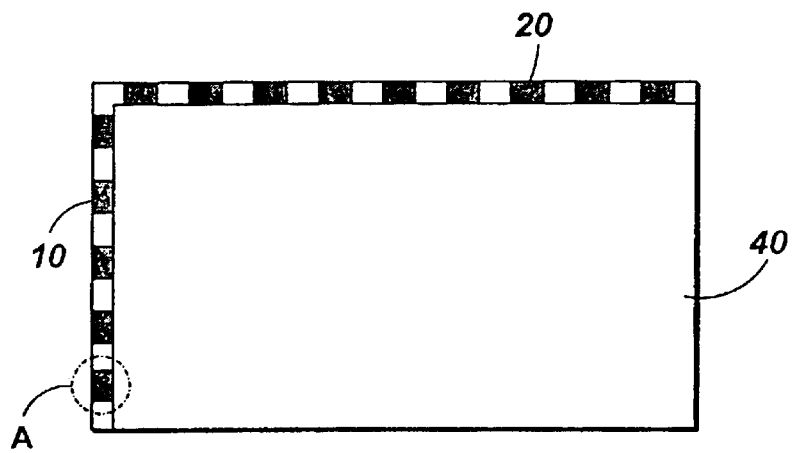
FIG. 1 schematically illustrates a conventional TFT assembly having data pads and gear pads.
Figure 2:
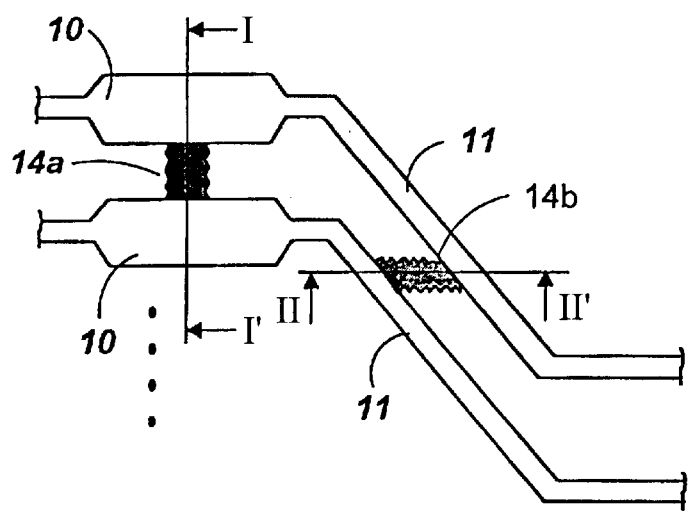
FIG. 2 is an enlarged view of a circled portion A of FIG. 1 for illustrating short circuits occurring between pads and between link lines.
Figure 3A:
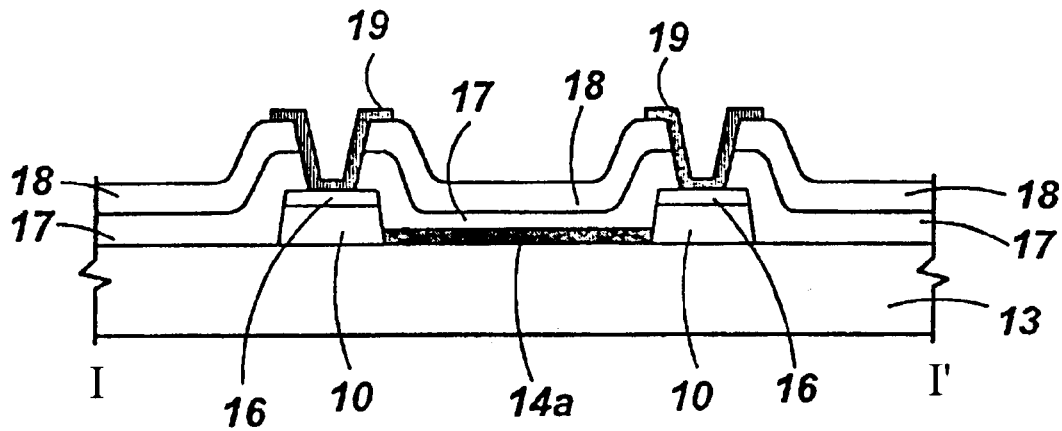
FIGS. 3a and 3b are sectional views taken along lines I—I and II—II of FIG. 2, respectively.
Figure 3B:
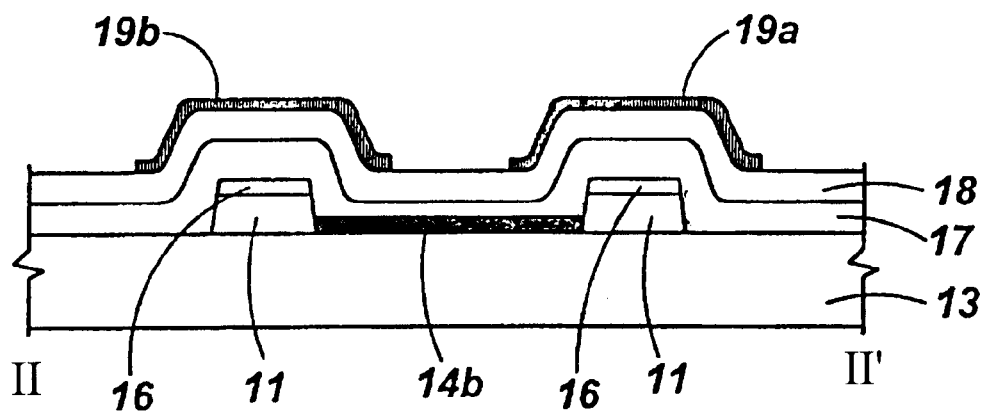

Reference will now be made in detail to the present preferred embodiment of the invention, as example of which is illustrated in the accompanying drawings. The same reference numbers are used in the drawings to refer to the same or like parts.

Figure 4A:
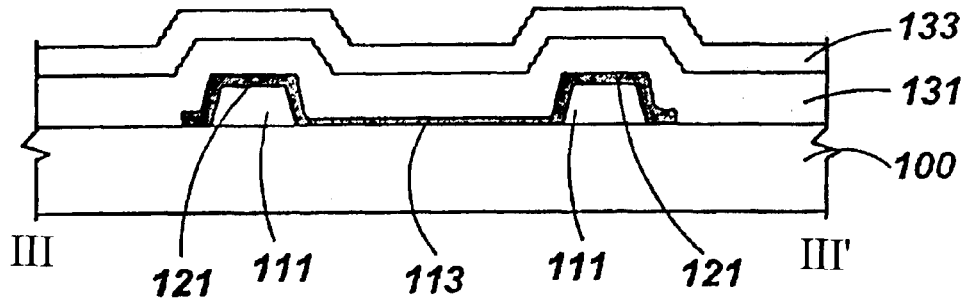
FIGS. 4a to 4c are sectional views taken along a line III—III of FIG. 6 and illustrate a pad portion of a TFT assembly as it undergoes sequential processing steps in accordance with a preferred embodiment of the present invention.
Figure 4B:
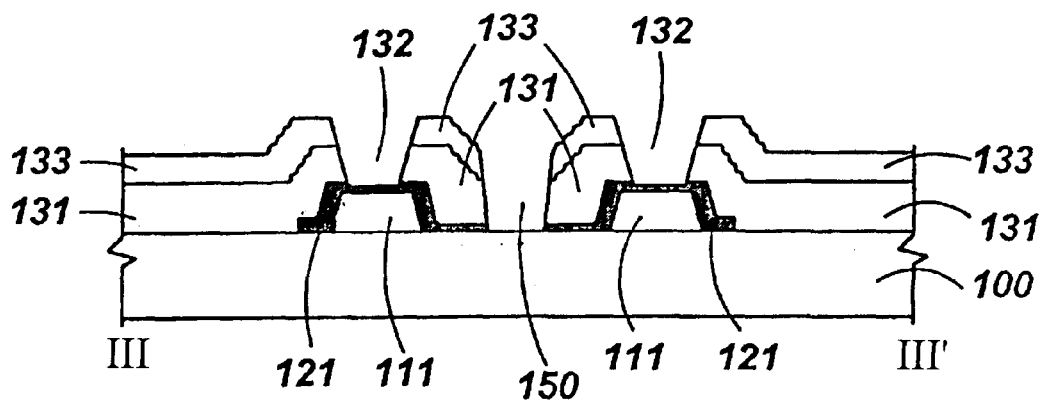
Figure 4C:
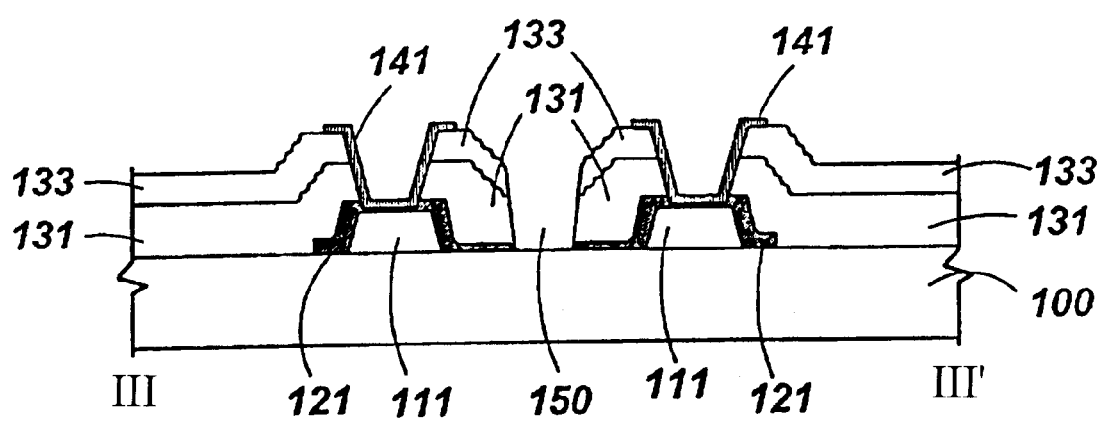

FIGS. 4a to 4c show, in cross-section views, a portion of a TFT assembly where pads are formed as it undergoes sequential processing steps in accordance with a preferred embodiment of the present invention.

As shown in fig. 4a, gate pads 111 are formed on a substrate 100 by, for example, an evaporation process, and a metal layer 121 is optionally formed on the gate pads 111 using, for example, a masking process. Preferably, the gate pads are made of aluminum or an aluminum alloy material, and the metal layer 121 is formed of molybdenum. Other suitable materials known in the art may also be used.

During the above steps, a metal remainder 113 may be formed, connecting the gate pads 111 to each other. This is caused by defective patterning of the metal layer 121 and/or the gate pads 111, and results in a short circuit between adjacent gate pads 111. However, even if the metal remainder 113 is formed, an insulating layer 131 and a passivation layer 133 are deposited on the substrate 100 to cover both the gate pads 111 and the metal layer 121.

Subsequently, as shown in FIG. 4b, portions of the insulating and passivation layers 131 and 133 corresponding to the gate pads 111 are dry-etched to form contact holes 132 for the ITO electrodes. Preferably at the same time, portions of the insulating and passivation layers 131 and 133 between the pads 111 are also dry-etched, so that a short circuit disconnecting channel or insulating channel 150 is formed while removing the metal remainder 113 connecting the adjacent gate pads 111, thereby disconnecting the short circuit.

Next, a conductive material such as an ITO material is deposited on the passivation layer 133 while contacting the metal layer 121 through the contacting holes 132, and is then wet-etched to form an ITO electrode pattern 141.

During the above steps, the metal remainder 113 may not be completely removed by dry-etching the insulating and passivation layers 131 and 133, particularly in the case where the metal remainder 113 is formed by a defective pattern of the gate pads, i.e., where the metal remainder 113 is an aluminum or aluminum alloy material. In the present invention, the metal remainder 113 is preferably further removed by the wet-etching step that is performed to form the ITO electrode pattern 141. The surface of the substrate which is exposed by etching the insulating layer is etched concurrently with the etching process for forming the electrode pattern. This ensures that short circuits between the pads will not occur.

Figure 5A:
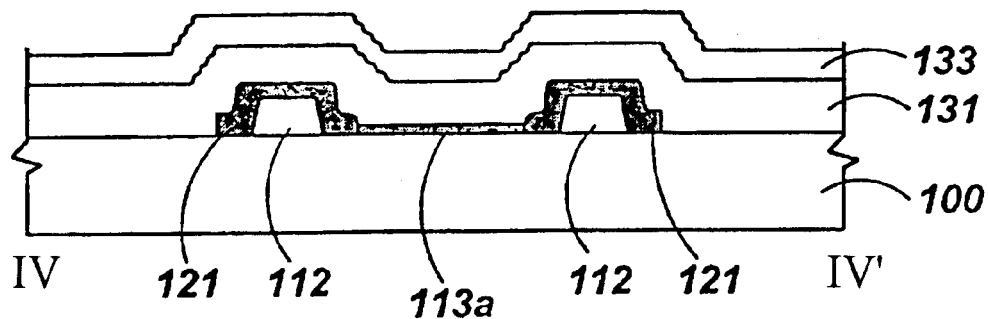
FIGS. 5a to 5c are sectional views taken along a line IV—IV of FIG. 6 and illustrate a link line portion of a TFT assembly as it undergoes sequential processing steps in accordance with a preferred embodiment of the present invention.
Figure 5B:
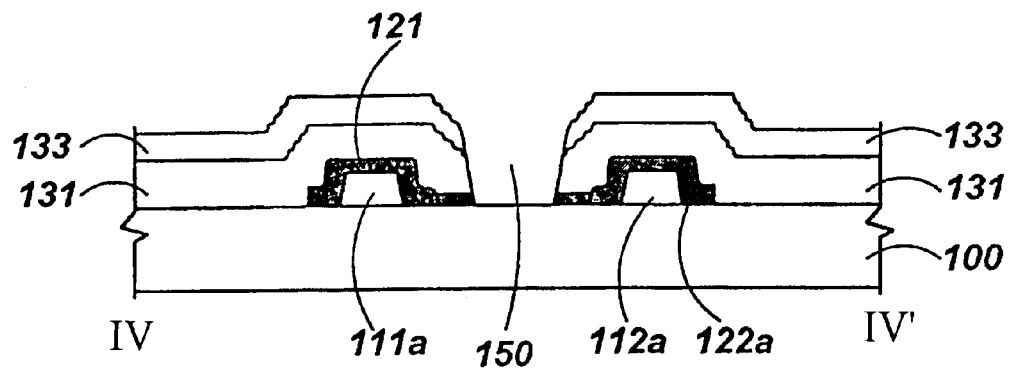
Figure 5C:
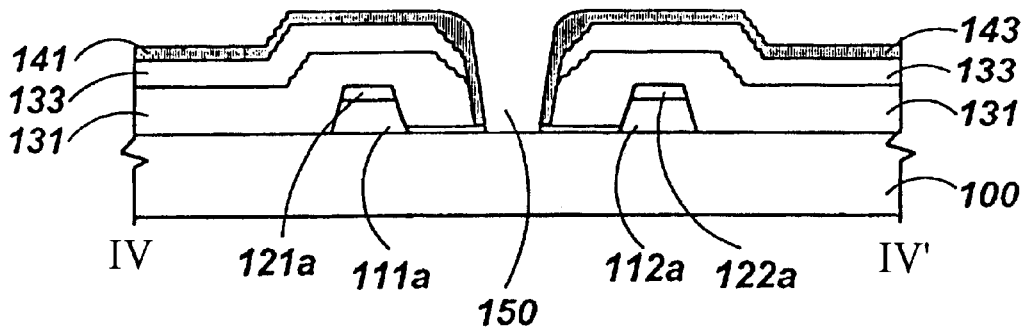

FIGS. 5a to 5c show, in cross-section views, a link line portion of the TFT assembly as it undergoes sequential processing steps in accordance with a preferred embodiment of the present invention.

Preferably, the insulating layer between adjacent link lines is etched simultaneously with the etching of the insulating layer between the adjacent pads. In other words, the steps shown in FIGS. 5a to 5c are performed concurrently with the steps shown in FIGS. 4a to 4c, respectively. That is, link lines 112 for transmitting signals from the gate pads 111 to the gate lines ere formed concurrently with the gate pads 111 shown in FIG. 4a. Since insulating and passivation layers 131 and 133 are identical to those described with reference to FIGS. 4a to 4c, the detailed description thereof is omitted.

However, since it is not necessary to form the ITO electrodes on the link lines 112, portions of the insulating and passivation layers 131 and 133 corresponding to the link lines 112 are not etched during the etching step shown in FIG. 4b. Therefore, only portions of the insulating and passivation layers 131 and 133 between adjacent link lines 112 are etched to form a short circuit disconnecting channel or insulating channel 150 while removing the metal remainder 113a, thereby removing short circuits or electrical connections between the adjacent link lines.

An ITO electrode layer 143 is formed simultaneously with, and using the same steps as, the ITO electrode pattern 141 shown is FIG. 4c.

In the case where the metal remainder 113a is not completely removed so that the short is not disconnected as shown in FIG. 5b, the metal remainder 113a is completely removed by the wet-etching process that is performed when ITO is etched to form the electrode pattern 143.

Figure 6:
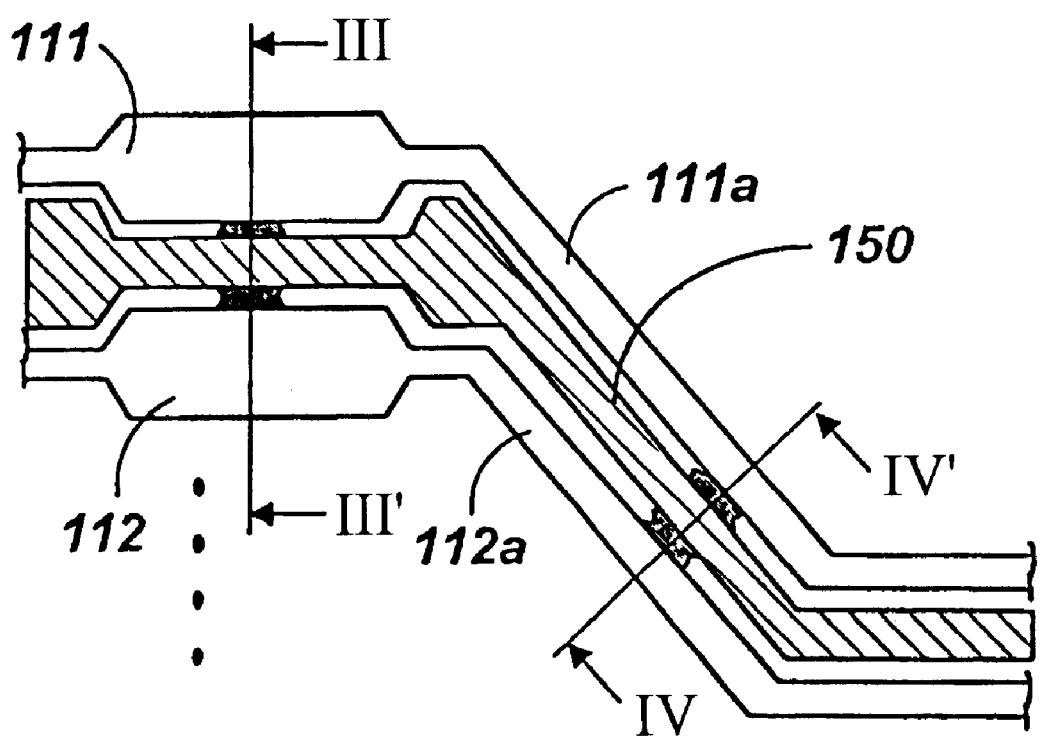
FIG. 6 schematically illustrates a TFT assembly according to a preferred embodiment of the present invention.

Therefore, as shown in FIG. 6, the short-disconnecting channel 150 is formed running along between the adjacent pads 111 and between the adjacent link lines 112. Preferably, the short-disconnecting channel 150 is formed extending toward the link lines by etching the insulating layer between the adjacent link lines. The short-disconnecting channel may optionally be filled with an insulating material.

While the present invention has been described in connection with what is presently considered to be the most practical and preferred embodiment, it is to be understood that the invention is not limited to the disclosed embodiments and various modifications are possible. For example, the concept of the present invention may be used in making a plasma display panel as wail as a TFT LCD. Thus, it is intended that the present invention cover the modifications and variations of the embodiments that come within the scope of the appended claims and their equivalents.

What is claimed is:

1. A semiconductor device comprising:
   a substrate;
   a plurality of conductive structures formed on the substrate;
   a metal layer formed on a top surface and at least one side surface of the plurality of conductive structures;
   an insulating layer formed on the substrate, the conductive structures, and the metal layer;
   an electrode pattern formed on the insulating layer, the electrode pattern contacting at least the metal layers through a plurality of contact holes in the insulating layer; and
   at least one insulating channel between adjacent conductive structures, a surface of the substrate being exposed through the insulating channel.

2. The device of claim 1, wherein the insulating layer comprise a first insulating lever; and a passivation layer.

3. The device of claim 1, wherein the electrode pattern is formed of indium tin oxide.

4. The device of claim 1, wherein the insulating channel is formed by etching the insulating layer between the adjacent conductive structures.

5. The device of claim 1, wherein the insulating channel is formed by dry-etching the insulating layer between the adjacent conductive structures.

6. The device of claim 1, wherein the semiconductor device is a thin film transistor device used to control a liquid crystal display.

7. The semiconductor device of claim 1, in the semiconductor device is a thin film transistor assembly having array lines, and wherein the conductive structures are pads for transmitting signals to the array lines.

8. The semiconductor device of claim 7, wherein the pads are formed of aluminum or an aluminum alloy and the metal layer on the pads is formed of molybdenum.

9. The semiconductor device of claim 1, wherein the semiconductor device is a thin film transistor assembly having array lines and pads, and wherein the conductive structures are link lines for transmitting signals from the pads to the array lines.

10. The semiconductor device of claim 1, wherein the semiconductor device is a thin film transistor assembly having array lines, and wherein the conductive structures include pads and link lines for transmitting drive signals to the array lines.

* * * * *